United States Patent
Satou et al.

(10) Patent No.: US 8,394,911 B2
(45) Date of Patent: Mar. 12, 2013

(54) PHENOL RESIN COMPOSITION, PRODUCTION METHOD THEREFOR, CURABLE RESIN COMPOSITION, CURED PRODUCT THEREOF, AND PRINTED CIRCUIT BOARD

(75) Inventors: Yutaka Satou, Ichihara (JP); Kazuo Arita, Ichihara (JP); Ichirou Ogura, Sakura (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/577,235

(22) PCT Filed: Jan. 19, 2011

(86) PCT No.: PCT/JP2011/050827
§ 371 (c)(1),
(2), (4) Date: Aug. 3, 2012

(87) PCT Pub. No.: WO2011/096273
PCT Pub. Date: Aug. 11, 2011

(65) Prior Publication Data
US 2012/0308832 A1 Dec. 6, 2012

(30) Foreign Application Priority Data
Feb. 3, 2010 (JP) .................... 2010-022078

(51) Int. Cl.
C08G 8/04 (2006.01)
C08G 14/04 (2006.01)
H01R 12/00 (2006.01)
H05K 1/00 (2006.01)

(52) U.S. Cl. ........................ 528/153; 439/85
(58) Field of Classification Search ............ 528/153; 439/85
See application file for complete search history.

(56) References Cited

U.S. PATENT DOCUMENTS
4,404,357 A * 9/1983 Taylor et al. .................. 528/153
(Continued)

FOREIGN PATENT DOCUMENTS
JP 62-169828 A 7/1987
(Continued)

OTHER PUBLICATIONS
Machine Translation of JP 2008101038 A, 2012.*
(Continued)

Primary Examiner — Liam Heincer
(74) Attorney, Agent, or Firm — Edwards Wildman Palmer LLP

(57) ABSTRACT

A phenol resin composition used as a curing agent for an epoxy resin includes a naphthol novolac resin (a1) represented by general formula (1) (wherein $R^1$ and $R^2$ each independently represent a hydrogen atom, an alkyl group, or an alkoxy group, and n is a repeating unit and an integer of 1 or more), and a compound (a2) represented by general formula (2) (wherein $R^1$ and $R^2$ each independently represent a hydrogen atom, an alkyl group, or an alkoxy group), wherein the total ratio of compounds with n=1 and n=2 in the general formula (1) present in the composition is in the range of 10 to 35%, the average of n in the general formula (1) is in the range of 3.0 to 7.0, and the content of the compound (a2) in the composition is 1 to 6%.

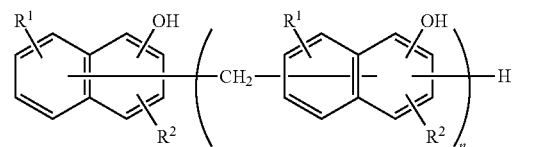

(1)

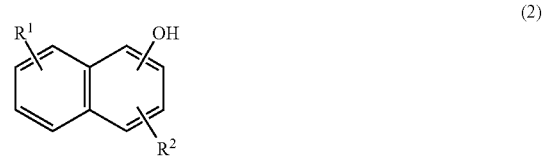

(2)

16 Claims, 5 Drawing Sheets

U.S. PATENT DOCUMENTS

| | | | | |
|---|---|---|---|---|
| 4,424,315 A | * | 1/1984 | Taylor et al. | 525/501 |
| 4,551,508 A | * | 11/1985 | Urasaki | 525/507 |
| 4,812,551 A | * | 3/1989 | Oi et al. | 528/129 |
| 5,023,311 A | * | 6/1991 | Kubota | 528/153 |
| 5,155,202 A | * | 10/1992 | Morita et al. | 528/97 |
| 5,206,333 A | * | 4/1993 | Sue et al. | 528/139 |
| 5,302,673 A | * | 4/1994 | Naka et al. | 525/481 |
| 5,334,674 A | * | 8/1994 | Naka et al. | 525/481 |
| 5,424,167 A | * | 6/1995 | Uetani et al. | 430/191 |
| 5,459,223 A | * | 10/1995 | Sue et al. | 528/153 |
| 5,510,446 A | * | 4/1996 | Sue et al. | 528/153 |
| 5,571,886 A | * | 11/1996 | Zampini | 528/143 |
| 5,780,571 A | * | 7/1998 | Ohno et al. | 528/97 |
| 5,789,522 A | * | 8/1998 | Zampini et al. | 528/129 |
| 6,043,333 A | * | 3/2000 | Kuboki et al. | 528/98 |
| 6,124,420 A | * | 9/2000 | Kuboki et al. | 528/87 |
| 6,166,131 A | * | 12/2000 | Tashima et al. | 525/54.5 |
| 6,194,491 B1 | * | 2/2001 | Fujii et al. | 523/466 |
| 6,207,789 B1 | * | 3/2001 | Sue et al. | 528/153 |
| 6,906,149 B2 | * | 6/2005 | Watanabe et al. | 526/62 |
| 7,005,216 B2 | * | 2/2006 | Shiraishi et al. | 430/5 |
| 7,659,051 B2 | * | 2/2010 | Yoon et al. | 430/313 |
| 7,985,822 B2 | * | 7/2011 | Ogura et al. | 528/87 |
| 2001/0051313 A1 | * | 12/2001 | Uetani et al. | 430/191 |
| 2003/0069357 A1 | * | 4/2003 | Kaji et al. | 525/107 |
| 2006/0234158 A1 | * | 10/2006 | Hatakeyama | 430/270.1 |
| 2008/0255315 A1 | * | 10/2008 | Ogura et al. | 525/403 |
| 2009/0054585 A1 | * | 2/2009 | Ogura et al. | 524/541 |
| 2009/0088535 A1 | * | 4/2009 | Arita et al. | 525/390 |
| 2009/0171061 A1 | * | 7/2009 | Sue et al. | 528/129 |
| 2010/0087590 A1 | * | 4/2010 | Ogura et al. | 524/540 |
| 2011/0009574 A1 | * | 1/2011 | Kita et al. | 525/472 |

FOREIGN PATENT DOCUMENTS

| | | | |
|---|---|---|---|
| JP | 04-323214 A | | 11/1992 |
| JP | 06-080598 A | | 3/1994 |
| JP | 07-215902 A | | 8/1995 |
| JP | 2000-038430 A | | 2/2000 |
| JP | 2007-031527 A | | 2/2007 |
| JP | 2008101038 A | * | 5/2008 |

OTHER PUBLICATIONS

International Search Report dated Apr. 26, 2011, issued for PCT/JP2011/050827.

* cited by examiner

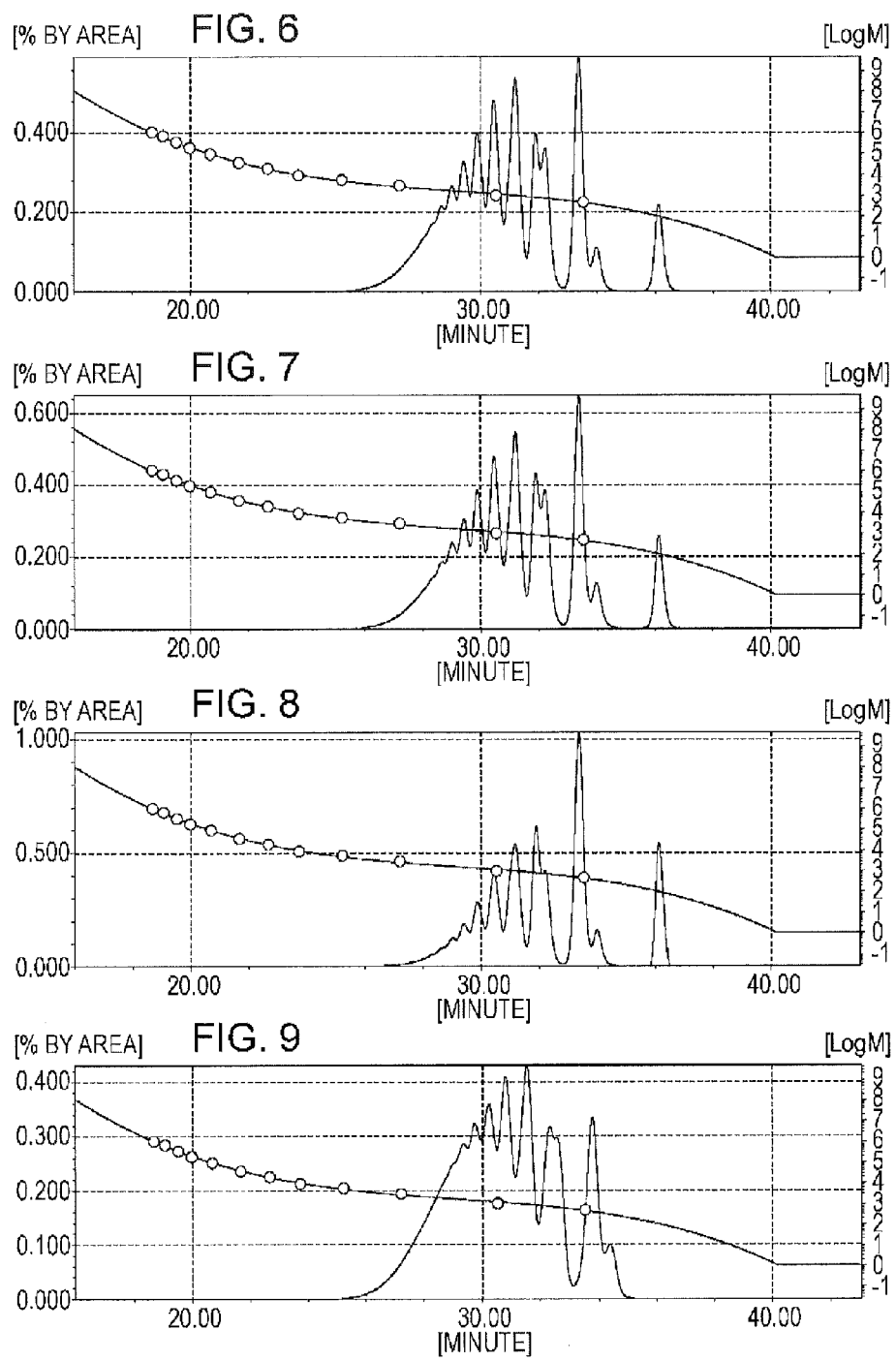

PHENOL RESIN COMPOSITION, PRODUCTION METHOD THEREFOR, CURABLE RESIN COMPOSITION, CURED PRODUCT THEREOF, AND PRINTED CIRCUIT BOARD

TECHNICAL FIELD

The present invention relates to a phenol resin composition which produces a cured product having excellent heat resistance and flame retardancy when used as a curing agent for an epoxy resin, a method for producing the same, a curable resin composition which can be preferably used for applications such as a printed circuit board, a semiconductor encapsulant, a coating material, cast molding, etc., a cured product thereof, and a printed circuit board.

BACKGROUND ART

Phenol resins are used for an adhesive, a molding material, a coating material, a photoresist material, a color developing material, an epoxy resin raw material, a curing agent for epoxy resins, etc., and in view of the excellent heat resistance and moisture resistance of resultant cured products, phenol resins are widely used as a curable resin composition containing a phenol resin as a main agent or a curable resin composition containing an epoxidized resin and a phenol resin as a curing agent for an epoxy resin in the electric and electronic field such as a semiconductor encapsulant, an insulating material for a printed circuit board, etc.

Among these various applications, in the field of printed circuit boards, the tendency toward higher densities due to narrowing of the wiring pitches of semiconductor devices becomes remarked with miniaturization and improvement in performance of electronic apparatuses. As a corresponding semiconductor mounting method, a flip-chip bonding system of bonding a semiconductor device and a substrate with solder balls is widely used. The flip-chip bonding system is a so-called reflow-system semiconductor mounting method in which solder balls are disposed between a circuit board and a semiconductor and the whole is heated to cause fused-junction between the circuit board and the semiconductor. Therefore, the circuit board is exposed to a high-heat environment during solder reflowing, and thus faulty connection may occur in wiring due to a decrease in elastic modulus of the circuit board at a high temperature. Therefore, a high-heat-resistant material capable of maintaining a high elastic modulus even at a high temperature is required as an insulating material used for printed circuit boards.

On the other hand, the insulating material for printed circuit boards has been mixed with a halogenated flame retardant such as bromine or the like, which is added for imparting flame retardancy together with an antimony compound. However, in recent efforts to environment and safety, there has been strong demand for an environmental safety-responsive flameproofing method without using the halogenated flame retardant concerned about dioxin generation and the antimony compound suspected for carcinogenicity.

In this way, an insulating material for printed circuit boards is required to have high degrees of heat resistance and flame retardancy, and naphthol resins produced by reaction between naphthol and formaldehyde are know as resin materials complying with the requirement (refer to Patent Literature 1 below).

When a naphthol resin described in Patent Literature 1 is used as a curing agent for an epoxy resin, a heat resistance-improving effect is observed in a cured product because of the stiffness of its chemical skeleton as compared with general phenol novolac resins, but flame retardancy is unsatisfactory. In particular, in use as a varnish for a laminated plate, interfacial peeling easily occurs in the laminated plate due to the low adhesion to a substrate such as a glass cloth.

In addition, as a technique using a naphthol resin as a curing agent for an epoxy resin, for example, Patent Literature 2 below discloses a technique for decreasing the melt viscosity of a semiconductor encapsulating material by using naphthol novolac containing excessive amounts of di- and tri-nuclear compounds, thereby improving workability. However, the naphthol resin described in Patent Literature 2 is easily decomposed under a high-heat condition and thus does not exhibit satisfactory heat resistance and flame retardancy.

CITATION LIST

Patent Literature

PTL 1: Japanese Unexamined Patent Application Publication No. 2007-31527
PTL 2: Japanese Unexamined Patent Application Publication No. 7-215902

SUMMARY OF INVENTION

Technical Problem

Accordingly, a problem to be solved by the present invention is to provide a curable resin composition exhibiting excellent performance as a cured product, such as excellent heat resistance and flame retardancy, and further exhibiting excellent interlayer adhesive strength when applied to a printed circuit board, a phenol resin composition which can be preferably used as a curing agent for an epoxy resin in the composition, a cured product of the curable resin composition, and a printed circuit board having excellent heat resistance, flame retardancy, and adhesion.

Solution to Problem

As a result of intensive research for resolving the problem, the inventors found that when a mixture containing a naphthol resin having a relatively high molecular weight and produced by reaction between naphthol and formaldehyde and a specified amount of free naphthol is used as a curing agent for an epoxy resin, a cured product exhibits heat resistance and flame retardancy, and further, when a composition containing the naphthol resin and an epoxy resin is used as a varnish for a printed circuit board, interlayer adhesive strength of the final resulting multilayer laminated plate is significantly improved, leading to the achievement of the present invention.

The present invention relates to a phenol resin composition containing a naphthol novolac resin (a1) represented by general formula (1) below

[Chem. 1]

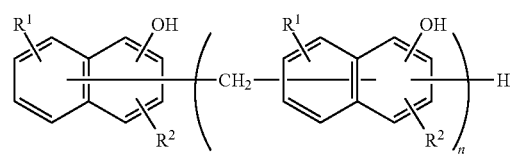

(1)

(wherein $R^1$ and $R^2$ each independently represent a hydrogen atom, an alkyl group, or an alkoxy group, and n is a repeating unit and an integer of 1 or more), and a compound (a2) represented by general formula (2) below

[Chem. 2]

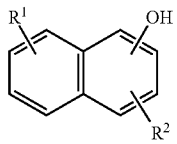

(2)

(wherein $R^1$ and $R^2$ each independently represent a hydrogen atom, an alkyl group, or an alkoxy group), wherein the total ratio of compounds with n=1 and n=2 in the general formula (1) present in the composition is in the range of 10 to 35% in terms of peak area in GPC measurement, the average of n in the general formula (1) is in the range of 3.0 to 7.0, and the content of the compound (a2) in the composition is 1 to 6% in terms of peak area in GPC measurement.

The present invention further relates to a method for producing a phenol resin composition, the method including reacting formaldehyde (f) with a compound (a2) represented by general formula (2) below

[Chem. 3]

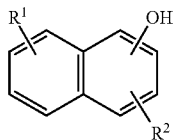

(2)

(wherein $R^1$ and $R^2$ each independently represent a hydrogen atom, an alkyl group, or an alkoxy group) under an acid catalyst so that the softening point of the product is in the range of 115 to 150° C., and a ratio of the residue of the compound (a2) is 1 to 6% in terms of peak area in GPC measurement.

The present invention further relates to a curable resin composition containing a curing agent (A) for an epoxy resin and an epoxy resin (B) as essential components, wherein the curing agent is the phenol resin composition.

The present invention further relates to a cured product produced by curing reaction of the curable resin composition.

The present invention further relates to a printed circuit board including a reinforcement substrate produced by impregnation with a varnish-like resin composition and then lamination, the varnish-like resin composition being prepared by mixing an organic solvent with the curable resin composition.

Advantageous Effects of Invention

According to the present invention, it is possible to provide a curable resin composition exhibiting excellent performance as a cured product, such as excellent heat resistance and flame retardancy, and further exhibiting excellent interlayer adhesive strength when applied to a printed circuit board, a phenol resin composition which can be preferably used as a curing agent for an epoxy resin in the composition, a cured product of the curable resin composition, and a printed circuit board having excellent heat resistance, flame retardancy, and adhesion.

BRIEF DESCRIPTION OF DRAWINGS

FIG. 6 is a GPC chart of phenol resin composition (A-4) produced in Example 4.
FIG. 7 is a GPC chart of phenol resin composition (A-5) produced in Example 5.
FIG. 8 is a GPC chart of phenol resin composition (A-6) produced in Comparative Example 1.
FIG. 9 is a GPC chart of phenol resin composition (A-7) produced in Comparative Example 2.

DESCRIPTION OF EMBODIMENTS

Figure 1:
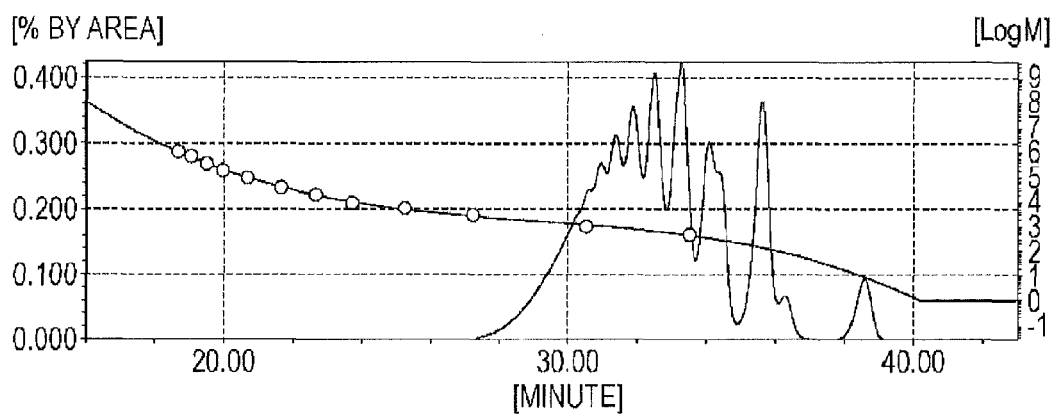
FIG. 1 is a GPC chart of phenol resin composition (A-1) produced in Example 1.

The present invention is described in detail below.
A phenol resin composition of the present invention contains a naphthol novolac resin (a1) represented by general formula (1) below

[Chem. 4]

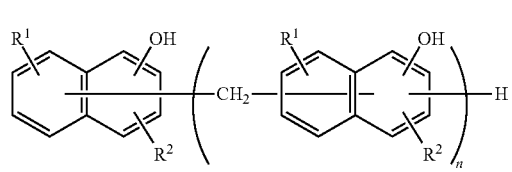

(1)

(wherein $R^1$ and $R^2$ each independently represent a hydrogen atom, an alkyl group, or an alkoxy group, and n is a repeating unit and an integer of 1 or more), and a compound (a2) represented by general formula (2) below

[Chem. 5]

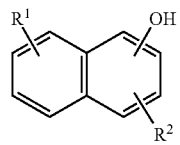

(2)

(wherein $R^1$ and $R^2$ each independently represent a hydrogen atom, an alkyl group, or an alkoxy group), wherein the total ratio of compounds with n=1 and n=2 in the general formula (1) present in the composition is in the range of 10 to 35% in terms of peak area in GPC measurement, the average of n in the general formula (1) is in the range of 3.0 to 7.0, and the content of the compound (a2) in the composition is 1 to 6% in terms of peak area in GPC measurement.

That is, when the total peak area of compounds with n=1 and n=2 in the general formula (1) according to GPC measurement is in the range of 10 to 35% in the phenol resin composition, and the average of n in the general formula (1) is in the range of 3.0 to 7.0, the naphthol novolac resin has a high molecular weight and a wide molecular weight distribution, is suppressed from thermal decomposition, and exhibits excellent heat resistance in combination with heat resistance possessed by a rigid naphthalene skeleton and significantly enhanced flame retardancy. In particular, from the viewpoint of excellent flame retardancy of a cured product, it is preferred that the total peak area of the compounds with n=1 and n=2 in the general formula (1) according to GPC measurement is in the range of 20 to 35% in the phenol resin composition, and the average of n in the general formula (1) is in the range of 3.0 to 5.0.

In addition, the content of the compound (a2) in the composition is 1 to 6% in terms of peak area in GPC measurement, and thus the viscosity of the phenol resin composition is decreased, and consequently a curing reaction sufficiently proceeds, thereby improving adhesion and significantly improving flame retardancy without significantly decreasing heat resistance. That is, a mononaphthol compound which has been removed for avoiding a decrease in heat resistance is allowed to remain or is added at a specified ratio, and thus the viscosity of the phenol resin composition can be decreased, improving curability. As a result, adhesion to a substrate such as a glass cloth can be improved without a decrease in heat resistance, and flame retardancy can be significantly improved.

Here, the area ratios of the compound (a2) and the total of compounds with n=1 and n=2 in GPC measurement are calculated, according to GPC measurement, as the area ratios of the peak area of compound (a2) and the total peak area of compounds with n=1 and n=2 relative to the total area of the phenol resin composition of the present invention. Specifically, values of the area ratios are calculated based on measurement by a method described below.

In addition, the average of n in the general formula (1) is a value calculated on the basis of the result of derivation of a number-average molecular weight excluding a peak of the compound (a2) in GPC measurement of the phenol resin composition.

<GPC Measurement Conditions>
3) GPC: Measurement conditions are as follows.
  Measurement apparatus: "HLC-8220 GPC" manufactured by Tosoh Corporation
  Column: Guard Column "HXL-L" manufactured by Tosoh Corporation
    "TSK-GEL G2000HXL" manufactured by Tosoh Corporation
    "TSK-GEL G2000HXL" manufactured by Tosoh Corporation
    "TSK-GEL G3000HXL" manufactured by Tosoh Corporation
    "TSK-GEL G4000HXL" manufactured by Tosoh Corporation
  Detector: RI (differential refractometer)
  Data processing: "GPC-8020 modelⅡ version 4.10" manufactured by Tosoh Corporation
  Measurement conditions:
  Column temperature 40° C.
  Developing solvent tetrahydrofuran
  Flow rate 1.0 ml/min Standard: using monodisperse polystyrene having a known molecular weight according to a measurement manual of the "GPC-8020 modelⅡ version 4.10".
  (Polystyrene Used)
    "A-500" manufactured by Tosoh Corporation
    "A-1000" manufactured by Tosoh Corporation
    "A-2500" manufactured by Tosoh Corporation
    "A-5000" manufactured by Tosoh Corporation
    "F-1" manufactured by Tosoh Corporation
    "F-2" manufactured by Tosoh Corporation
    "F-4" manufactured by Tosoh Corporation
    "F-10" manufactured by Tosoh Corporation
    "F-20" manufactured by Tosoh Corporation
    "F-40" manufactured by Tosoh Corporation
    "F-80" manufactured by Tosoh Corporation
    "F-128" manufactured by Tosoh Corporation
  Sample: prepared by filtering a tetrahydrofuran solution of 1.0% by mass in terms of resin solid content (50 μl) with a microfilter.

<Method for Calculating Content of Compound (a2) in Phenol Resin Composition>

The phenol resin composition is measured under the above-described GPC measurement conditions, and a ratio of the detected peak area of the compound (a2) to the total detected peak area of the phenol resin composition is calculated.

<Method for Calculating Total Ratio of Compounds with n=1 and n=2 Present in Phenol Resin Composition>

The phenol resin composition is measured under the above-described GPC measurement conditions, and a ratio of the total detected peak area of the compounds with n=1 and n=2 to the total detected peak area of the phenol resin composition is calculated.

<Method for Calculating Average of n in General Formula (1)>

The average of n in the general formula (1) is calculated according to a calculation expression below from the number-average molecular weight (Mn) which is determined, excluding the peak of the compound (a2), by measurement of the phenol resin composition under the above-described GPC measurement conditions. In the expression below, "X" represents a molecular weight corresponding to a compound with n=0 in the general formula (1) (represents the molecular weight of the compound (a2) when the naphthol novolac resin (a1) is produced from the same compound as the compound (a2)). In the present invention, even when a phenol novolac or alkylphenol novolac component (a3) described below is contained, the average of n is a value calculated by the calculation expression below.

$$n=(Mn-X)/(X+12)$$

In the general formula (1) of the naphthol novolac resin (a1), as described above, $R^1$ and $R^2$ are each independently a hydrogen atom, an alkyl group, or an alkoxy group. Examples of the alkyl group include alky groups having 1 to 4 carbon atoms, such as a methyl group, an ethyl group, an isopropyl group, a tert-butyl group, and the like. Examples of the alkoxy group include alkoxy groups having 1 to 4 carbon atoms, such as a methoxy group, an ethoxy group, an isopropoxy group, a tert-butoxy group, and the like. In the present invention, $R^1$ and $R^2$ are each preferably a hydrogen atom, a methyl group, an ethyl group, or a methoxy group, and particularly a hydrogen atom is preferred from the viewpoint of excellent flame retardancy of a cured product.

In addition, the naphthol skeleton in the general formula (1) may be either a α-naphthol skeleton or a β-naphthol skeleton, but in the present invention, the α-naphthol skeleton is preferred from the viewpoint of the significant effect of improving heat resistance. Further, in the present invention, the naphthol novolac resin (a1) is preferably a naphthol novolac resin using as a raw material the same compound as the compound (a2) from the viewpoint of excellent solvent solubility and excellent heat resistance and flame retardancy of a cured product.

Next, in the general formula (2) of the compound (a2), as described above, $R^1$ and $R^2$ are each independently a hydrogen atom, an alkyl group, or an alkoxy group. Examples of the alkyl group include alky groups having 1 to 4 carbon atoms, such as a methyl group, an ethyl group, an isopropyl group, a tert-butyl group and the like. Examples of the alkoxy group include alkoxy groups having 1 to 4 carbon atoms, such as a methoxy group, an ethoxy group, an isopropoxy group, a tert-butoxy group, and the like. In the present invention, $R^1$ and $R^2$ are each preferably a hydrogen atom, a methyl group, an ethyl group, or a methoxy group, and particularly a hydrogen atom is preferred from the viewpoint of good curability and excellent flame retardancy of a cured product.

The phenol resin composition of the present invention can be produced by mixing the naphthol novolac resin (a1) and the compound (a2) so that the area ratio of the compound (a2) in GPC measurement is 1 to 6%. However, as described above, a naphthol novolac resin using the same compound as the compound (a2) as a raw material is preferably used as the naphthol novolac resin (a1). In this case, the phenol resin composition is preferably produced by a method for producing a phenol resin composition of the present invention (hereinafter abbreviated as "method 1"), the method including reacting the compound (a2) represented by general formula (2) below

[Chem. 6]

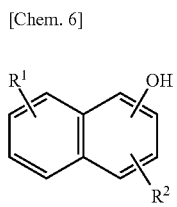

(2)

(wherein $R^1$ and $R^2$ each independently represent a hydrogen atom, an alkyl group, or an alkoxy group), and formaldehyde (f) under an acid catalyst so that the residual amount of the compound (a2) in the product is 1 to 6% in terms of peak area in GPC measurement, and the softening point of the product is 115 to 150° C., from the viewpoint of excellent industrial productivity, excellent uniformity of the mixture, and the more significant effect of improving flame retardancy and adhesion.

In the method 1, the reaction ratio between the compound (a2) and the formaldehyde (f) is preferably 0.6 to 0.8 in terms of molar ratio [formaldehyde (f)/compound (a2)] from the viewpoint of excellent flame retardancy and adhesion.

As a formaldehyde source of the formaldehyde (f) used in the reaction, for example, formalin, paraformaldehyde, trioxane, and the like can be used. As the formalin, 30 to 60% by mass of formalin is preferred from the viewpoint of water reducibility and production workability.

Examples of the acid catalyst used in the reaction include inorganic acids such as hydrochloric acid, sulfuric acid, phosphoric acid, and the like; organic acids such as methanesulfonic acid, p-toluenesulfonic acid, oxalic acid, and the like; and Lewis acids such as boron trifluoride, anhydrous aluminum chloride, zinc chloride, and the like. The amount of use is preferably in the range of 0.1 to 5% by weight relative to the total weight of the raw materials charged.

In the method 1, the reaction temperature is preferably in the range of 80 to 150° C. from the viewpoint of excellent reactivity.

The thus-produced phenol resin composition containing the polycondensate (a1) and the compound (a2) preferably has a softening point in the range of 110 to 150° C. in view of excellent balance between fluidity of the composition and heat resistance of a cured product.

The phenol resin composition of the present invention preferably contains the phenol novolac or alkylphenol novolac component (a3) in addition to the naphthol novolac resin (a1) and the compound (a2) from the viewpoint that flame retardancy and adhesion can be further improved without decreasing heat resistance of a cured product.

As the phenol novolac or alkylphenol novolac component (a3) (hereinafter, abbreviated as the "novolac component (a3)"), phenol novolac or alkylphenol novolac (n) and a polycondensate (a3') of the novolac (n), naphthol, and formaldehyde can be used. In particular, a resin component containing the novolac (n) and the polycondensate (a3') blended together is preferred from the viewpoint of the excellent effect of improving flame retardancy and adhesion.

The ratio of the novolac component (a3) present in the phenol resin composition is preferably such that the ratio of all phenol skeletons in the novolac component (a3) relative to all naphthol skeletons in the polycondensate (a1) and the compound (a2) is 0.01 to 0.2 in terms of the number of moles of phenol skeletons per mole of naphthol skeletons from the viewpoint of the excellent effect of improving flame retardancy and adhesion of a cured product.

The molar ratio of phenol skeletons per mole of naphthol skeletons is a value calculated on the basis of $^{13}$C-NMR measurement, and specifically calculated on the basis of measurement according to a method described below.

<$^{13}$C-NMR Measurement Conditions>

$^{13}$C-NMR: Measurement conditions are as follows.

Apparatus: AL-400 manufactured by JEOL, Ltd.

Measurement mode: SGNNE (NOE-suppressed 1H complete decoupling method)

Solvent: dimethylsulfoxide

Pulse angle: 45° C. pulse

Sample concentration: 30 wt %

Number of acquisitions: 10000

<Method for Calculating Molar Ratio of Phenol Skeletons Per Mole of Naphthol Skeletons>

In measurement of the phenol resin composition under the above-described $^{13}$C-NMR measurement conditions, a relation between the integrated value ($\alpha$) of a peak of a carbon atom, to which a hydroxyl group is bonded and which is detected between 145 ppm and 160 ppm, and the integrated value ($\beta$) of a peak of a carbon atom, to which a hydroxyl group is not bonded and which is detected between 100 ppm and 140 ppm, satisfies expression (1) and expression (2) below. Here, (X) represents the number of moles of naphthol skeletons, and (Y) represents the number of moles of phenol skeletons.

[Math. 1]

$$X+Y=\alpha \quad\quad\quad \text{Expression (1)}$$

$$9X+5Y=\beta \quad\quad\quad \text{Expression (2)}$$

Therefore, the molar ratio (Y/X) of phenol skeletons per mole of naphthol skeletons can be calculated from the expression (1) and expression (2) according to expression (3) below.

[Math. 2]

$$\frac{Y}{X} = \frac{9\alpha - \beta}{\beta - 5\alpha}$$ Expression (3)

A specific example of a method for mixing the novolac component (a3) in the phenol resin composition of the present invention is a method (hereinafter abbreviated as "method 2") in which in producing the phenol resin composition, the compound (a2) represented by general formula (2) below

[Chem. 7]

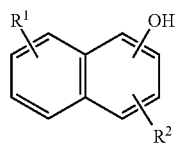

(2)

(wherein $R^1$ and $R^2$ each independently represent a hydrogen atom, an alkyl group, or an alkoxy group), the formaldehyde (f), and the phenol novolac or alkylphenol novolac component (a3) are reacted under an acid catalyst so that the residual amount of the compound (a2) in the product is 1 to 6% in terms of peak area in GPC measurement, and the softening point of the product is 115 to 150° C. In the present invention, the phenol resin composition containing the novolac component (a3) is preferably produced by the method 2 from the viewpoint that industrial productivity of the phenol resin composition is improved, the phenol resin composition has excellent uniformity, and the effect of improving flame retardancy and adhesion becomes more remarked.

Examples of the phenol novolac or alkylphenol novolac (a3) used in the method 2 include phenol novolac, cresol novolac, tert-butylphenol novolac, and the like. In the present invention, cresol novolac is preferred in view of excellent flame retardancy. The phenol novolac or alkylphenol novolac (a3) preferably has a softening point in the range of 60° C. to 120° C. and the average number of nuclei in the range of 3 to 10 determined by GPC measurement under the above-described conditions from the viewpoint that the effect of improving flame retardancy and adhesion is improved while maintaining high fluidity of the final resulting phenol resin composition.

The amount of the phenol novolac or alkylphenol novolac (n) used in the method 2 is preferably a ratio of 0.5 to 10% by mass of the raw material component. The raw material component stands for the total amount of the compound (a2), the formaldehyde (f), and the phenol novolac or alkylphenol novolac (a3). On the other hand, like in the method 1, the reaction ratio between the compound (a2) and the formaldehyde (f) is preferably such that the molar ratio [formaldehyde (f)/compound (a2)] is 0.6 to 0.8 from the viewpoint of excellent flame retardancy and adhesion.

Like in the method 1, examples of the acid catalyst used in the method 2 include inorganic acids such as hydrochloric acid, sulfuric acid, phosphoric acid, and the like; organic acids such as methanesulfonic acid, p-toluenesulfonic acid, oxalic acid, and the like; and Lewis acids such as boron trifluoride, anhydrous aluminum chloride, zinc chloride, and the like. The amount of use is preferably in the range of 0.1 to 5% by weight relative to the total weight of the raw materials charged.

The reaction temperature in the method 2 is preferably in the range of 80 to 150° C. in view of excellent reactivity.

The phenol resin composition produced by the method 2 preferably has a softening point in the range of 110 to 150 in view of an excellent balance between fluidity of the composition and heat resistance of a cured product.

As described above, the phenol resin composition detailed above is particularly useful as a curing agent for an epoxy resin. Therefore, in view of the excellent effect of improving heat resistance, flame retardancy, and adhesion, the phenol resin composition is preferably used as a curing agent (A) for an epoxy resin in a curable resin composition of the present invention which contains the curing agent (A) for an epoxy resin and an epoxy resin (B) as essential components.

As the epoxy resin (B), various epoxy resins can be used. Examples thereof include bisphenol epoxy resins such as bisphenol A epoxy resins, bisphenol F epoxy resins, and the like; biphenyl epoxy resins such as biphenyl epoxy resins, tetramethylbiphenyl epoxy resins, and the like; novolac epoxy resins such as phenol novolac epoxy resins, cresol novolac epoxy resins, bisphenol A novolac epoxy resins, epoxy compounds of condensates of phenols and phenolic hydroxyl group-containing aromatic aldehyde, biphenylnovolac epoxy resins, and the like; triphenylmethane epoxy resins; tetraphenylethane epoxy resins; dicyclopentadiene-phenol addition reaction-type epoxy resins; phenolaralkyl epoxy resins; epoxy resins each having a naphthalene skeleton in its molecular structure, such as naphthol novolac epoxy resins, naphtholaralkyl epoxy resins, naphthol-phenol co-condensated novolac epoxy resins, naphthol-cresol co-condensated novolac epoxy resins, diglycidyloxynaphthalene; 1,1-bis(2,7-diglycidyloxy-1-naphthyl)alkanes, and the like; and phosphorus atom-containing epoxy resins. These epoxy resins may be used alone or as a mixture of two or more.

Examples of the phosphorus atom-containing epoxy resins include epoxy compounds of 9,10-dihydro-9-oxa-10-phosphaphenanthrene-10-oxide (hereinafter abbreviated as "HCA"), epoxy compounds of phenol resins produced by reaction between HCA and quinones, HCA-modified phenol novolac epoxy resins, HCA-modified cresol novolac epoxy resins, bisphenol A epoxy resins modified with phenol resins produced by reaction between HCA and quinones, and the like.

Among the above-described epoxy resins, the epoxy resins each having a naphthalene skeleton in its molecular structure and the phenol novolac epoxy resins are preferred particularly in view of heat resistance, and the bisphenol epoxy resins and the novolac epoxy resins are preferred in view of solvent solubility.

The mixing ratio between the curing agent (A) for an epoxy resin and the epoxy resin (B) which are detailed above is preferably such that the equivalent ratio (epoxy group/hydroxyl group) of epoxy groups in the epoxy resin (B) to phenolic hydroxyl groups in the phenol resin composition is 1/1.5 to 1/0.7 in view of excellent heat resistance.

The curable resin composition of the present invention uses the phenol resin composition as the curing agent for an epoxy resin, but if required, another curing agent (A') for an epoxy resin may be properly combined. Usable examples of the other curing agent for an epoxy resin include various known curing agents such as an amine-based compound, an amide-based compound, an acid anhydride-based compound, a phenol-based compound, and the like. Specific examples of the amine-based compound include diaminodiphenylmethane, diethylenetriamine, triethylenetetramine, diaminodiphenylsulfone, isophoronediamine, imidazole, $BF_3$-amine complex, guanidine derivatives, and the like. Examples of the amide-based compound include dicyandiamide, a polyamide resin synthesized from linolenic acid dimer and ethylenediamine, and the like. Examples of the acid anhydride-based compound include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like. Examples of the phenol-based compound include polyhydric phenol compounds such as phenol novolac resins, cresol novolac resins, aromatic hydrocarbon formaldehyde resin-modified phenol resins, dicyclopentadienephenol addition-type resins, phenol aralkyl resins (Xylok resin), naphthol aralkyl resins, trimethylolmethane resins, tetraphenylolethane resins, naphthol novolac resins, naphthol-phenol co-condensated novolac resins, naphthol-cresol co-condensated novolac resins, biphenyl-modified phenol resins (polyhydric phenol compounds each having phenol nuclei connected through a bismethylene group), biphenyl-modified naphthol resins (polyhydric naphthol compounds each having phenol nuclei connected through a bismethylene group), aminotriazine-modified phenol resins (polyhydric phenol compounds each having phenol nuclei connected through melamine or benzoguanamine), alkoxy group-containing aromatic ring-modified novolac resins (polyhydric phenol compounds each having phenol nuclei and alkoxy group-containing aromatic rings connected through formaldehyde), and the like.

When the other curing agent (A') for an epoxy resin is used, the amount of use is preferably such that the equivalent ratio (active hydrogen/hydroxyl group) of active hydrogen in the curing agent (A') for an epoxy resin and phenolic hydroxyl group in the curing agent (A) for an epoxy resin is in the range of 1/10 to 5/1.

If required, the curable resin composition of the present invention may be appropriately combined with a curing accelerator. As the curing accelerator, various compounds can be used, and for example, a phosphorus-based compound, a tertiary amine, imidazole, an organic acid metal salt, a Lewis acid, an amine complex salt, and the like can be used. In particular, in application to a semiconductor encapsulant, from the viewpoint of excellent curability, heat resistance, electric characteristics, and wetproof reliability, 2-ethyl-4-methylimidazole is preferred as the imidazole, triphenylphosphine is preferred as the phosphorus-based compound, and 1,8-diazabicyclo-[5.4.0]-undecene (DBU) is preferred as the tertiary amine.

When the above-detailed curable resin composition of the present invention is prepared as varnish for a printed circuit board, an organic solvent (C) is preferably mixed with above-described components. Examples of the organic solvent which can be used include methyl ethyl ketone, acetone, dimethylformamide, methyl isobutyl ketone, methoxypropanol, cyclohexanone, methyl cellosolve, ethyl diglycol acetate, propylene glycol monomethyl ether acetate, and the like. The organic solvent and the amount of use thereof can be appropriately selected, but, for example, in application to a printed circuit board, a polar solvent having a boiling point of 160° C. or less, such as methyl ethyl ketone, acetone, dimethylformamide, or the like is preferably used at a ratio of 40 to 80% by mass in terms of nonvolatile content. In application to an adhesive for build-up, examples of the organic solvent which is preferably used include ketones such as acetone, methyl ethyl ketone, cyclohexanone, and the like; acetates such as ethyl acetate, butyl acetate, cellosolve acetate, propylene glycol monomethyl ether acetate, carbitol acetate, and the like; carbitols such as cellosolve, butyl carbitol, and the like; aromatic hydrocarbons such as toluene, xylene, and the like; dimethylformamide; dimethylacetamide; N-methyl pyrrolidone; and the like. Such an organic solvent is preferably used at a ratio of 30 to 60% by mass in terms of nonvolatile content.

In addition, the curable resin composition may further contain a non-halogen flame retardant substantially not containing a halogen atom which is mixed for further enhancing flame retardancy, for example, in the field of printed circuit boards.

Examples of the non-halogen flame retardant include a phosphorus-based flame retardant, a nitrogen-based flame retardant, a silicone-based flame retardant, an inorganic flame retardant, an organic metal salt-based flame retardant, and the like. Use of these flame retardants is not particularly limited, and they may be used alone or in combination of a plurality of flame retardants of the same type or different types.

As the phosphorus-based flame retardant, either an inorganic type or an organic type can be used. Examples of an inorganic compound include red phosphorus; ammonium phosphates such as monoammonium phosphate, diammonium phosphate, triammonium phosphate, ammonium polyphosphate, and the like; and inorganic nitrogen-containing phosphorus compounds such as phosphoric amide, and the like.

The red phosphorus is preferably surface-treated for preventing hydrolysis or the like. Examples of a surface treatment method include (i) a method of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method of coating with a mixture of an inorganic compound, such as magnesium hydroxide, aluminum hydroxide, zinc hydroxide, or titanium hydroxide, and a thermosetting resin, such as a phenol resin, (iii) a doubly coating method of coating with a film of an inorganic compound such as magnesium hydroxide, aluminum hydroxide, zinc hydroxide, or titanium hydroxide, and coating the film with a thermosetting resin such as a phenol resin, and the like.

Examples of the organic phosphorus compound include general-purpose organic phosphorus compounds such as phosphate compounds, phosphonic acid compounds, phosphinic acid compounds, phosphine oxide compounds, phospholan compounds, organic nitrogen-containing phosphorus compounds, and the like; cyclic organic phosphorus compounds such as 9,10-dihydro-9-oxa-10-phosphaphenanthrene=10-oxide, 10-(2,5-dihydroxyphenyl)-10H-9-oxa-10-phosphaphenanthrene=10-oxide, 10-(2,7-dihydroxynaphthyl)-10H-9-oxa-10-phosphaphenanthrene=10-oxide, and the like; and derivatives produced by reaction of the phosphorus compounds with a compound such as an epoxy resin, a phenol resin, or the like.

The mixing amount is appropriately selected according to the type of the phosphorus-based flame retardant, the other components of the curable resin composition, and the desired degree of flame retardancy. For example, when red phosphorus is used as the non-halogen flame retardant, the flame retardant is preferably mixed in a rage of 0.1 to 2.0 parts by mass in 100 parts by mass of the curable resin composition containing all of the epoxy resin, the curing agent, the non-halogen flame retardant, filler, and the other additives. Similarly, when the organic phosphorus compound is used, it is preferably mixed in the range of 0.1 to 10.0 parts by mass, particularly preferably in the range of 0.5 to 6.0 parts by mass.

When the phosphorus-based flame retardant is used, the phosphorus-based flame retardant may be combined with hydrotalcite, magnesium hydroxide, a boron compound, zirconium oxide, a black dye, calcium carbonate, zeolite, zinc molybdate, activated carbon, or the like.

Examples of the nitrogen-based flame retardant include triazine compounds, cyanuric acid compounds, isocyanuric acid compounds, phenothiazine, and the like, and the triazine compounds, the cyanuric acid compounds, and the isocyanuric acid compounds are preferred.

Examples of the triazine compounds include melamine, acetoguanamine, benzoguanamine, melon, melam, succinoguanamine, ethylenedimelamine, melamine polyphosphate, triguanamine, (i) aminotriazine sulfate compounds such as guanylmelamine sulfate, melem sulfate, melam sulfate, and the like; (ii) co-condensates of phenols, such as phenol, cresol, xylenol, butylphenol, and nonylphenol, with melamines and formaldehyde, such as melamine, benzoguanamine, acetoguanamine, and formguanamine; (iii) mixtures of the co-condensates (ii) and phenol resins such as phenol-formaldehyde condensates; and (iv) the co-condensates (ii) and the mixtures (iii) further modified with tung oil, isomerized linseed oil, or the like.

Examples of the cyanuric acid compounds include cyanuric acid, melamine cyanurate, and the like.

The amount of the nitrogen-based flame retardant mixed is appropriately selected according to the type of the nitrogen-based flame retardant, the other components of the curable resin composition, and the desired degree of flame retardancy. For example, the nitrogen-based flame retardant is preferably mixed in the range of 0.05 to 10 parts by mass, particularly preferably in the range of 0.1 to 5 parts by mass, in 100 parts by mass of the curable resin composition containing all of the epoxy resin, the curing agent, the non-halogen flame retardant, filler, and the other additives.

In addition, the nitrogen-based flame retardant may be used in combination with a metal hydroxide, a molybdenum compound, or the like.

The silicone-based flame retardant is not particularly limited and can be used as long as it is an organic compound containing a silicon atom. Examples thereof include silicone oil, silicone rubber, silicone resins, and the like.

The amount of the silicone-based flame retardant mixed is appropriately selected according to the type of the silicone-based flame retardant, the other components of the curable resin composition, and the desired degree of flame retardancy. For example, the silicone-based flame retardant is preferably mixed in the range of 0.05 to 20 parts by mass in 100 parts by mass of the curable resin composition containing all of the epoxy resin, the curing agent, the non-halogen flame retardant, filler, and the other additives. In addition, the silicone-based flame retardant may be used in combination with a molybdenum compound, alumina, or the like.

Examples of the inorganic flame retardant include metal hydroxides, metal oxides, metal carbonate compounds, metal powders, boron compounds, low-melting-point glass, and the like.

Examples of the metal hydroxides include aluminum hydroxide, magnesium hydroxide, dolomite, hydrotalcite, calcium hydroxide, barium hydroxide, zirconium hydroxide, and the like.

Examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, tungsten oxide, and the like.

Examples of the metal carbonate compounds include zinc carbonate, magnesium carbonate, calcium carbonate, barium carbonate, basic magnesium carbonate, aluminum carbonate, iron carbonate, cobalt carbonate, titanium carbonate, and the like.

Examples of the metal powders include powders of aluminum, iron, titanium, manganese, zinc, molybdenum, cobalt, bismuth, chromium, nickel, copper, tungsten, tin, and the like.

Examples of the boron compounds include zinc borate, zinc metaborate, barium metaborate, boric acid, borax, and the like.

Examples of the low-melting-point glass include Seaplea (Bokusui Brown Co., Ltd.), hydrated glass $SiO_2$—MgO—$H_2O$, and PbO—$B_2O_3$-based, ZnO—$P_2O_5$—MgO-based, $P_2O_5$—$B_2O_3$—PbO—MgO-based, P—Sn—O—F-based, PbO—$V_2O_5$—$TeO_2$-based, $Al_2O_3$—$H_2O$-based, and lead borosilicate-based glass compounds.

The amount of the inorganic flame retardant mixed is appropriately selected according to the type of the inorganic flame retardant, the other components of the curable resin composition, and the desired degree of flame retardancy. For example, the inorganic flame retardant is preferably mixed in the range of 0.5 to 50 parts by mass, particularly preferably in the range of 5 to 30 parts by mass, in 100 parts by mass of the curable resin composition containing all of the epoxy resin, the curing agent, the non-halogen flame retardant, filler, and the other additives.

Examples of the organic metal salt-based flame retardant include ferrocene, acetylacetonate metal complexes, organic metal carbonyl compounds, organic cobalt salt compounds, organic sulfonic acid metal salts, compounds each having an ionic bond or coordinate bond between a metal atom and an aromatic compound or heterocyclic compound, and the like.

The amount of the organic metal salt-based flame retardant mixed is appropriately selected according to the type of the organic metal salt-based flame retardant, the other components of the curable resin composition, and the desired degree of flame retardancy. For example, the organic metal salt-based flame retardant is preferably mixed in the range of 0.005 to 10 parts by mass in 100 parts by mass of the curable resin composition containing all of the epoxy resin, the curing agent, the non-halogen flame retardant, filler, and the other additives.

If required, an inorganic filler can be mixed in the curable resin composition of the present invention. Examples of the inorganic filler include fused silica, crystalline silica, alumina, silicon nitride, aluminum hydroxide, and the like. When the amount of the inorganic filler mixed is particularly increased, the fused silica is preferably used. Although either crushed or spherical fused silica can be used, the spherical fused silica is preferably mainly used for increasing the amount of the fused silica mixed and suppressing an increase in melt viscosity of a molding material. In order to further increase the amount of the spherical silica mixed, the grain size distribution of the spherical silica is preferably properly adjusted. The filling rate is preferably in the range of 0.5 to 100 parts by mass in 100 parts by mass of the curable resin composition. In addition, in use for an application such as a conductive paste, conductive filler such as a silver powder, a copper powder, or the like can be used.

If required, various compounding agents such as a silane coupling agent, a mold release agent, a pigment, an emulsifier, etc. can be added to the curable resin composition of the present invention.

The curable resin composition of the present invention can be produced by uniformly mixing the above-described components. The curable resin composition containing the epoxy resin and the curing agent of the present invention, and further containing a curing accelerator according to demand can be easily formed into a cured product by the same as a general known method. Examples of the cured product include molded cured products such as a laminate, a cast product, an adhesive layer, a coating film, a film, and the like.

Applications using the curable resin composition of the present invention include printed circuit board materials, resin casting materials, adhesives, interlayer insulating materials for build-up substrates, adhesive films for build-up, and the like. Among these various applications, in applications to an insulating material for a printed circuit board and electronic circuit board and an adhesive film for build-up, the curable resin composition can be used as an insulating material for a so-called electronic component-built-in substrate in which a passive component such as a capacitor and an active component such as an IC chip are embedded in the substrate. In particular, the curable resin composition is preferably used as a printed circuit board material and an adhesive film for build-up from the viewpoint of characteristics such as high heat resistance and flame retardancy.

A method for producing a printed circuit board using the curable resin composition of the present invention is, for example, a method of impregnating a reinforcement substrate with a varnish-like resin composition, which is prepared by further mixing the organic solvent (C) with a varnish-like curable resin composition containing the organic solvent (C), and then heat and pressure bonding a copper foil laminated on the substrate. As the reinforcement substrate, paper, a glass cloth, a glass nonwoven fabric, aramid paper, an aramid cloth, a glass mat, a glass roving cloth, and the like can be used. In further detail, the method first includes heating the varnish-like curable resin composition at a heating temperature according to the type of solvent used, preferably 50 to 170° C., to form a prepreg as a cured product. The mass ratio between the resin composition and reinforcement substrate used is not particularly limited but is preferably adjusted so that the resin content in the prepreg is 20 to 60% by mass. Next, the prepregs formed as described above are stacked by a usual method, and a copper foil is appropriately laminated thereon and heat-pressure bonded at 170 to 250° C. for 10 minutes to 3 hours under a pressure of 1 to 10 MPa, thereby producing the intended printed circuit board.

When the curable resin composition of the present invention is used as a resist ink, as a usable method, for example, a resist ink composition is prepared by adding a cationic polymerization catalyst as a catalyst for the curable resin composition and further a pigment, talc, and filler, applied on a printed board by a screen printing method, and then cured to form a resist ink cured product.

When the curable resin composition of the present invention is used as conductive paste, examples of a usable method include a method of preparing a composition for an anisotropic conductive film by dispersing conductive fine particles in the curable resin composition, and a method of preparing a circuit-connecting paste resin composition or an anisotropic conductive adhesive which is liquid at room temperature.

As a method for producing an interlayer insulating material for a build-up board from the curable resin composition of the present invention, for example, the curable resin composition appropriately containing rubber and filler is applied to a circuit board having a circuit formed thereon by a spray coating method, a curtain coating method, or the like, and then cured. Then, if required, predetermined through holes are formed, and then a surface is treated with a coarsening agent, washed with hot water to form projections and depressions, and then plated with a metal such as copper. As the plating method, electroless plating and electrolytic plating are preferred, and an oxidizer, an alkali, and an organic solvent can be used as the coarsening agent. Such an operation is successively repeated according to demand to alternately build up a resin insulating layer and a conductor layer of a predetermined circuit pattern, thereby producing a build-up board. However, the through holes are formed after the outermost resin insulating layer is formed. In addition, a build-up substrate can be formed by pressure-bonding a copper foil with a resin, which is formed by semi-curing the resin composition on the copper foil, under heating at 170 to 250° C. on the circuit board having a circuit formed thereon, without the steps of forming a coarsened surface and of plating.

A method for producing an adhesive film for build up from the curable resin composition of the present invention is, for example, a method of applying the curable resin composition of the present invention on a support film to form a resin composition layer, thereby forming an adhesive film for a multilayer printed circuit board.

When the curable resin composition of the present invention is used for an adhesive film for build up, it is important for the adhesive film to soften at a lamination temperature condition (usually 70° C. to 140° C.) in a vacuum lamination method and to exhibit fluidity (resin flow) which permits resin filling in via holes or through holes present in the circuit board at the same time as lamination on the circuit board. Therefore, the above-described components are preferably mixed so as to exhibit these characteristics.

The through holes in the multilayer printed circuit board generally have a diameter of 0.1 to 0.5 mm and a depth of 0.1 to 1.2 mm, and can be filled with the resin within this range. When both surfaces of the circuit board are laminated, the through holes are preferably about ½ filled.

Specifically, the method for producing the adhesive film includes preparing the varnish-like curable resin composition of the present invention, applying the varnish-like composition on a surface of a support film (y), and further drying the organic solvent by heating or hot air spraying to form a curable resin composition layer (x).

The thickness of the layer (x) formed is not less than the thickness of the conductor layer. Since the thickness of the conductor layer provided in the circuit board is generally in the range of 5 to 70 µm, the thickness of the resin composition layer is preferably 10 to 100 µm.

The layer (x) according to the present invention may be protected by a protecting film described below. Protecting by the protecting film can prevent adhesion of dust to the surface of the resin composition layer and scratches thereon.

Examples of the support film and the protecting film include films of polyolefins such as polyethylene, polypropylene, polyvinyl chloride, and the like, polyesters such as polyethylene terephthalate (may be abbreviated as "PET" hereinafter), polyethylene naphthalate, and the like, polycarbonate, polyimide, release paper, and metal foils such as a copper foil, an aluminum foil, and the like. The support film and the protecting film may be subjected to MAD treatment, corona treatment, or release treatment.

The thickness of the support film is not particularly limited, but is generally 10 to 150 µm and preferably in the range of 25 to 50 µm. The thickness of the protecting film is preferably 1 to 40 µm.

The support film (y) is separated after being laminated on the circuit board or after the insulating film is formed by heat curing. When the support film (y) is separated after the adhesive film is heat-cured, adhesion of dust in the curing step can be prevented. When the support film is separated after curing, generally, the support film is previously subjected to release treatment.

Next, in the method for producing the multilayer printed circuit board using the adhesive film formed as described above, for example, when the layer (x) is protected by the protecting film, the protecting film is separated, and then the layer (x) is laminated on one or both surfaces of the circuit board by, for example, a vacuum lamination method so that the layer is in direct contact with the circuit board. The lamination method may be a butch mode or a continuous mode using a roll. In addition, if required, the adhesive film and the circuit board may be heated (preheated) before the lamination.

The lamination is preferably performed under the lamination conditions including a pressure bonding temperature (lamination temperature) of 70° C. to 140° C. and a pressure-bonding pressure of 1 to 11 kgf/cm$^2$ (9.8×10$^4$ to 107.9×10$^4$ N/m$^2$), and under reduced air pressure of 20 mmHg (26.7 hPa) or less.

A method for producing a cured product of the present invention may be based on a general method for curing a curable resin composition. For example, a heating temperature condition may be appropriately selected according to the type of the curing agent combined and use thereof, but the composition prepared by the above-described method may be heated in the temperature range of room temperature to about 250° C.

Therefore, when the cured product is produced by using the phenol resin composition, heat resistance and flame retardancy are exhibited, thereby permitting application to most-advanced printed circuit board materials. In addition, the phenol resin composition can be easily efficiently produced by the production method of the present invention, and molecular design can be realized according to the level of the above-described intended performance.

EXAMPLES

Next, the present invention is described in further detail with reference to examples and comparative examples, and "parts" and "%" below are on a mass basis unless otherwise specified. In addition, a softening point, GPC, and $^{13}$C-NMR, and MS were measured under conditions below.

1) Softening point measuring method: according to JIS K7234

2) GPC: The measurement conditions are as follows.
Measurement apparatus: "HLC-8220 GPC" manufactured by Tosoh Corporation
Column: Guard Column "HXL-L" manufactured by Tosoh Corporation
  "TSK-GEL G2000HXL" manufactured by Tosoh Corporation
  "TSK-GEL G2000HXL" manufactured by Tosoh Corporation
  "TSK-GEL G3000HXL" manufactured by Tosoh Corporation
  "TSK-GEL G4000HXL" manufactured by Tosoh Corporation
Detector: RI (differential refractometer)
Data processing: "GPC-8020 model∥ version 4.10" manufactured by Tosoh Corporation
Measurement conditions:
Column temperature 40° C.
Developing solvent tetrahydrofuran
Flow rate 1.0 ml/min Standard: using monodisperse polystyrene having a known molecular weight according to a measurement manual of the "GPC-8020 model∥version 4.10".

(Polystyrene Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: prepared by filtering, with a microfilter, a tetrahydrofuran solution of 1.0% by mass in terms of solid content (50 μl).

3) $^{13}$C-NMR: The measurement conditions are as follows.
Apparatus: AL-400 manufactured by JEOL, Ltd.
Measurement mode: SGNNE (NOE-suppressed 1H complete decoupling method)
Solvent: dimethylsulfoxide
Pulse angle: 45° C. pulse
Sample concentration: 30 wt %
Number of acquisitions: 10000

4) MS: double-focusing mass spectrometer AX505H (FD505H) manufactured by JEOL, Ltd.

Example 1

In a flask provided with a thermometer, a dropping funnel, a cooling tube, a fractionating column, and a stirrer, 505 parts by mass (3.50 moles) of α-naphthol, 158 parts by mass of water, and 5 parts by mass of oxalic acid were charged, and the resultant mixture was stirred under heating from room temperature to 100° C. over 45 minutes. Then, 177 parts by mass (2.45 moles) of a 42 mass % aqueous formalin solution was added dropwise over 1 hour. After the completion of addition, the mixture was further stirred at 100° C. for 1 hour and then heated to 180° C. over 3 hours. After the completion of reaction, water remaining in the reaction system was removed by heating under reduced pressure to yield 498 parts by mass of phenol resin composition (A-1).

The resultant phenol resin composition (A-1) had a softening point of 133° C. (B & R method) and a hydroxyl equivalent of 154 g/eq. FIG. 1 shows a GPC chart of the phenol resin composition (A-1).

The area ratio of α-naphthol monomer in the phenol resin composition (A-1) according to GPC measurement was 3.0%, the average of n in the general formula (1) (component having hydrogen atoms as R$^1$ and R$^2$) was 3.9, and the total area ratio of dinuclear and trinuclear compounds (total of compounds with n=1 and n=2 in the general formula (1) having hydrogen atoms as R$^1$ and R$^2$) in the phenol resin composition (A-1) according to GPC measurement was 27.0%.

Example 2

Figure 2:
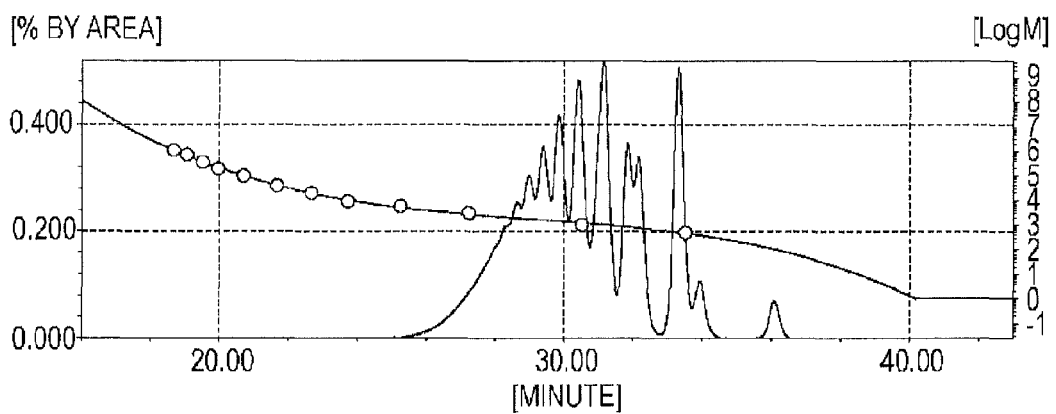
FIG. 2 is a GPC chart of phenol resin composition (A-2) produced in Example 2.

In a flask provided with a thermometer, a dropping funnel, a cooling tube, a fractionating column, and a stirrer, 505 parts by mass (3.50 moles) of α-naphthol, 21 parts (number of moles of cresol skeletons: 0.18 moles) of cresol novolac resin having a softening point of 75° C. (B & R method), 158 parts by mass of water, and 5 parts by mass of oxalic acid were charged, and the resultant mixture was stirred under heating from room temperature to 100° C. over 45 minutes. Then, 186 parts by mass (2.57 moles) of a 42 mass % aqueous formalin solution was added dropwise over 1 hour. After the completion of addition, the mixture was further stirred at 100° C. for 1 hour and then heated to 180° C. over 3 hours. After the completion of reaction, part of free α-naphthol was removed by spraying stream under heating and reduced pressure to produce 505 parts by mass of phenol resin composition (A-2). The resultant phenol resin composition (A-2) had a softening point of 137° C. (B & R method) and a hydroxyl equivalent of 155 g/eq. FIG. 2 shows a GPC chart of the phenol resin composition (A-2).

The area ratio of α-naphthol monomer in the phenol resin composition (A-2) according to GPC measurement was 1.5%, the average of n in the general formula (1) (component having hydrogen atoms as $R^1$ and $R^2$) was 4.0, and the total area ratio of dinuclear and trinuclear compounds (total of compounds with n=1 and n=2 in the general formula (1) having hydrogen atoms as $R^1$ and $R^2$) in the phenol resin composition (A-2) according to GPC measurement was 27.5%.

Example 3

Figure 3:
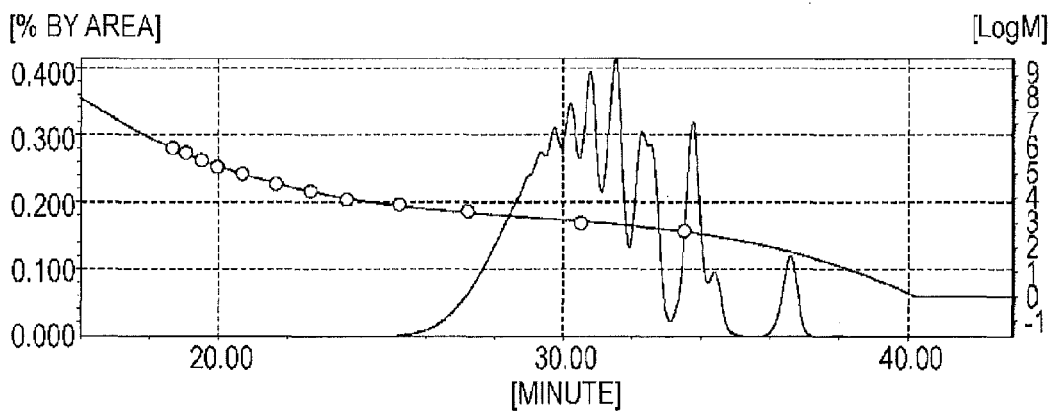
FIG. 3 is a GPC chart of phenol resin composition (A-3) produced in Example 3.
Figure 4:
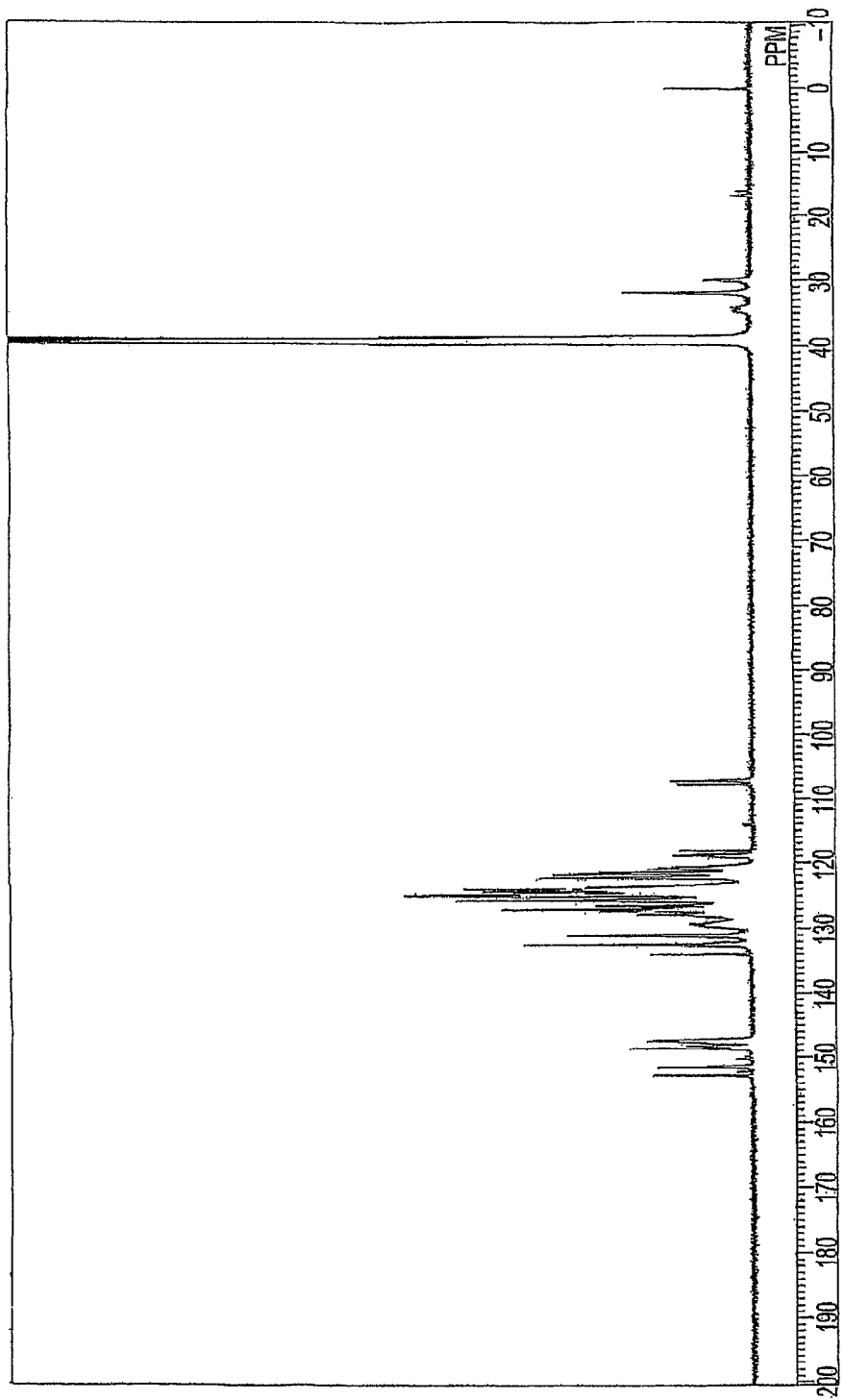
FIG. 4 is a $^{13}$C-NMR chart of phenol resin composition (A-3) produced in Example 3.
Figure 5:
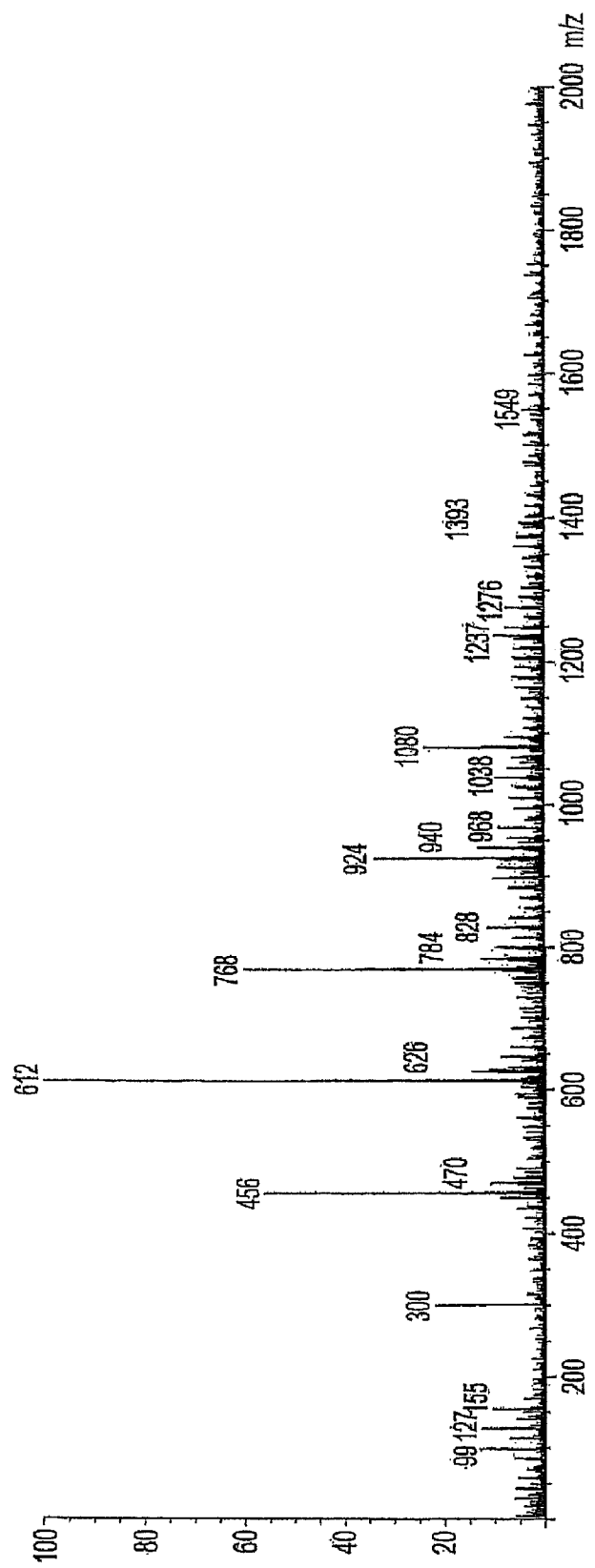
FIG. 5 shows a FD-MS spectrum of phenol resin composition (A-3) produced in Example 3.

According to the same method as in Example 1 except that the raw material components were changed to 505 parts by mass (3.50 moles) of α-naphthol, 21 parts by mass (number of moles of cresol skeletons: 0.18 moles) of cresol novolac resin having a softening point of 75° C. (B & R method), and 186 parts by mass (2.57 moles) of a 42 mass % aqueous formalin solution, 521 parts by mass of phenol resin composition (A-3) was produced. The resultant phenol resin composition (A-3) had a softening point of 129° C. (B & R method) and a hydroxyl equivalent of 152 g/eq. FIG. 3 shows a GPC chart of the phenol resin composition (A-3), FIG. 4 shows a $^{13}$C-NMR chart, and FIG. 5 shows a FD-MS spectrum.

The area ratio of α-naphthol monomer in the phenol resin composition (A-3) according to GPC measurement was 3.8%, the average of n in the general formula (1) (component having hydrogen atoms as $R^1$ and $R^2$) was 4.0, and the total area ratio of dinuclear and trinuclear compounds (total of compounds with n=1 and n=2 in the general formula (1) having hydrogen atoms as $R^1$ and $R^2$) in the phenol resin composition (A-3) according to GPC measurement was 26.4%. In addition, the molar ratio of phenol skeletons per mole of naphthol skeletons was 0.05.

Example 4

According to the same method as in Example 3 except that as the raw material components, the amount of the 42 mass % aqueous formalin solution was changed to 180 parts by mass (2.49 moles), 510 parts by mass of phenol resin composition (A-4) was produced. The resultant phenol resin composition (A-4) had a softening point of 120° C. (B & R method) and a hydroxyl equivalent of 152 g/eq. FIG. 6 shows a GPC chart of the phenol resin composition (A-4).

The area ratio of α-naphthol monomer in the phenol resin composition (A-4) according to GPC measurement was 4.6%, the average of n in the general formula (1) (component having hydrogen atoms as $R^1$ and $R^2$) was 3.8, and the total area ratio of dinuclear and trinuclear compounds (total of compounds with n=1 and n=2 in the general formula (1) having hydrogen atoms as $R^1$ and $R^2$) in the phenol resin composition (A-4) according to GPC measurement was 30.5%. In addition, the molar ratio of phenol skeletons per mole of naphthol skeletons was 0.05.

Example 5

According to the same method as in Example 3 except that as the raw material components, the amount of the 42 mass % aqueous formalin solution was changed to 173 parts by mass (2.39 moles), 502 parts by mass of phenol resin composition (A-5) was produced. The resultant phenol resin composition (A-5) had a softening point of 113° C. (B & R method) and a hydroxyl equivalent of 152 g/eq. FIG. 7 shows a GPC chart of the phenol resin composition (A-5).

The area ratio of α-naphthol monomer in the phenol resin composition (A-5) according to GPC measurement was 5.50, the average of n in the general formula (1) (component having hydrogen atoms as $R^1$ and $R^2$) was 3.3, and the total area ratio of dinuclear and trinuclear compounds (total of compounds with n=1 and n=2 in the general formula (1) having hydrogen atoms as $R^1$ and $R^2$) in the phenol resin composition (A-5) according to GPC measurement was 33.6%. In addition, the molar ratio of phenol skeletons per mole of naphthol skeletons was 0.05.

Comparative Example 1

In a flask provided with a thermometer, a dropping funnel, a cooling tube, a fractionating column, and a stirrer, 505 parts by mass (3.50 moles) of α-naphthol, 21 parts (number of moles of cresol skeletons: 0.18 moles) of cresol novolac resin having a softening point of 75° C. (B & R method), 158 parts by mass of water, and 5 parts by mass of oxalic acid were charged, and the resultant mixture was stirred under heating from room temperature to 100° C. over 45 minutes. Then, 146 parts by mass (2.02 moles) of a 42 mass % aqueous formalin solution was added dropwise over 1 hour. After the completion of addition, the mixture was further stirred at 100° C. for 1 hour and then heated to 180° C. over 3 hours. After the completion of reaction, water remaining in the reaction system was removed by heating under reduced pressure to produce 505 parts by mass of phenol resin composition (A-6). The resultant phenol resin composition (A-6) had a softening point of 95° C. (B & R method) and a hydroxyl equivalent of 151 g/eq. FIG. 8 shows a GPC chart of the phenol resin composition (A-6).

The area ratio of α-naphthol monomer in the phenol resin composition (A-6) according to GPC measurement was 10.2%, the average of n in the general formula (1) (component having hydrogen atoms as $R^1$ and $R^2$) was 2.3, and the total area ratio of dinuclear and trinuclear compounds (total of compounds with n=1 and n=2 in the general formula (1) having hydrogen atoms as $R^1$ and $R^2$) in the phenol resin composition (A-6) according to GPC measurement was 46.0%. In addition, the molar ratio of phenol skeletons per mole of naphthol skeletons was 0.05.

Comparative Example 2

In a flask provided with a thermometer, a dropping funnel, a cooling tube, a fractionating column, and a stirrer, 505 parts by mass (3.50 moles) of α-naphthol, 158 parts by mass of water, and 5 parts of oxalic acid were charged, and the resultant mixture was stirred under heating from room temperature to 100° C. over 45 minutes. Then, 186 parts by mass (2.45 moles) of a 42 mass % aqueous formalin solution was added dropwise over 1 hour. After the completion of addition, the mixture was further stirred at 100° C. for 1 hour and then heated to 180° C. over 3 hours. After the completion of reaction, free α-naphthol was removed by heating to 200° C. and spraying stream under heating and reduced pressure to produce 475 parts by mass of naphthol novolac compound (A-7). The resultant naphthol novolac compound (A-7) had a softening point of 142° C. (B & R method) and a hydroxyl equivalent of 157 g/eq. FIG. 8 shows a GPC chart of the naphthol novolac compound (A-7).

The area ratio of α-naphthol monomer in the naphthol novolac compound (A-7) according to GPC measurement was 00, the average of n in the general formula (1) (component having hydrogen atoms as $R^1$ and $R^2$) was 4.0, and the total area ratio of dinuclear and trinuclear compounds (total of compounds with n=1 and n=2 in the general formula (1) having hydrogen atoms as $R^1$ and $R^2$) in the naphthol novolac compound (A-7) according to GPC measurement was 27.4%.

Comparative Example 3

Figure 10:
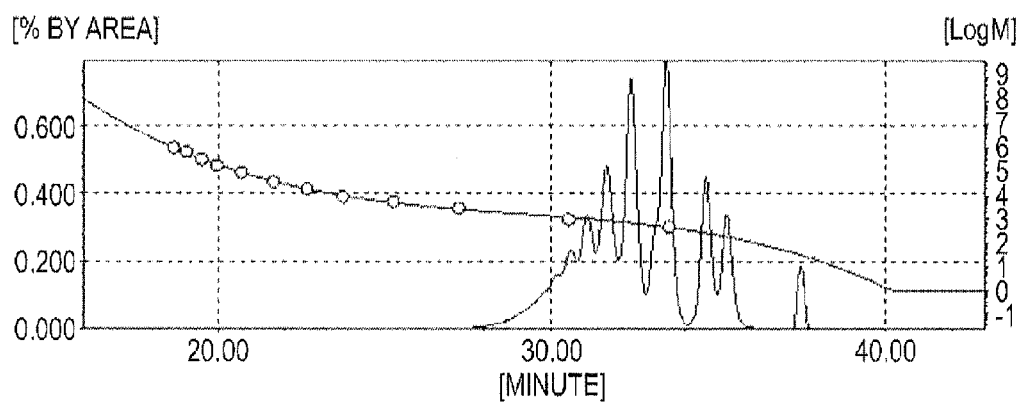
FIG. 10 is a GPC chart of phenol resin composition (A-8) produced in Comparative Example 3.

In a flask provided with a thermometer, a dropping funnel, a cooling tube, a fractionating column, and a stirrer, 505 parts by mass (3.50 moles) of α-naphthol and 80 parts by mass (2.45 moles) of 92 mass of paraformaldehyde were charged, and the resultant mixture was stirred under heating from room temperature to 110° C. Then, the mixture was stirred at 110° C. for 2 hours and then heated to 180° C. over 3 hours. After the completion of reaction, free α-naphthol was removed by heating to 200° C. and heating under educed pressure to produce 475 parts by mass of phenol resin composition (A-8). The resultant phenol resin composition (A-8) had a softening point of 103° C. (B & R method) and a hydroxyl equivalent of 152 g/eq. FIG. 10 shows a GPC chart of the phenol resin composition (A-8).

The area ratio of α-naphthol monomer in the phenol resin composition (A-8) according to GPC measurement was 2.7%, the average of n in the general formula (1) (component having hydrogen atoms as $R^1$ and $R^2$) was 2.9, and the total area ratio of dinuclear and trinuclear compounds (total of compounds with n=1 and n=2 in the general formula (1) having hydrogen atoms as $R^1$ and $R^2$) in the phenol resin composition (A-8) according to GPC measurement was 40.6%.

Examples 6 to 10 and Comparative Examples 4 to 6

According to compositions shown in Table 1 below, "N-770" (phenol novolac epoxy resin, epoxy equivalent: 183 g/eq) manufactured by DIC corporation as an epoxy resin, each of the phenol resin components (A-1) to (A-8), and 2-ethyl-4-methylimidazole (2E4MZ) as a curing accelerator were mixed, and methyl ethyl ketone was mixed so that the nonvolatile content (N. V.) of each composition was finally 58% by mass.

Next, a laminated plate was formed on an experimental basis by curing under conditions described below and evaluated with respect to heat resistance, adhesion, and flame retardancy by methods described below. The results are shown in Table 1.

<Conditions for Forming Laminated Plate>

Substrate: Glass Cloth "#2116" (210×280 mm) manufactured by Nitto Boseki Co., Ltd.

Number of plies: 6 Prepregnating condition: 160° C.

Curing conditions: 1.5 hours at 210° C. and 40 kg/cm$^2$

Thickness after molding: 0.8 mm

<Heat Resistance (Glass Transition Temperature)>

A temperature with the maximum change in elastic modulus (maximum rate of change in tan δ) was evaluated as the glass transition temperature using a viscoelasticity measuring apparatus (DMA: solid viscoelasticity measuring apparatus RSAII manufactured by Rheometric Scientific Inc., rectangular tension method; frequency 1 Hz, heating rate 3° C./min).

<Adhesion (Interlayer Peel Strength)>

Interlayer peel strength: evaluated according to JIS-K6481.

<Flame Retardancy>

According to the UL-94 test method, a combustion test was conducted using five test pieces with a thickness of 0.8 mm.

TABLE 1

|  |  |  | Example 6 | Example 7 | Example 8 | Example 9 | Example 10 | Comparative Example 4 | Comparative Example 5 | Comparative Example 6 |
|---|---|---|---|---|---|---|---|---|---|---|
| Composition | Phenol resin component | A-1 | 45.7 |  |  |  |  |  |  |  |
|  |  | A-2 |  | 45.9 |  |  |  |  |  |  |
|  |  | A-3 |  |  | 45.4 |  |  |  |  |  |
|  |  | A-4 |  |  |  | 45.4 |  |  |  |  |
|  |  | A-5 |  |  |  |  | 45.4 |  |  |  |
|  |  | A-6 |  |  |  |  |  | 45.2 |  |  |
|  |  | A-7 |  |  |  |  |  |  | 46.2 |  |
|  |  | A-8 |  |  |  |  |  |  |  | 45.4 |
|  | Epoxy resin | N-770 | 54.3 | 54.1 | 54.6 | 54.6 | 54.6 | 54.8 | 53.8 | 54.6 |
|  | 2E4MZ |  | 0.05 | 0.05 | 0.05 | 0.05 | 0.05 | 0.05 | 0.05 | 0.05 |
| Heat resistance (° C.) |  |  | 232 | 236 | 231 | 228 | 227 | 209 | 231 | 213 |
| Interlayer peel strength (kN/m) |  |  | 0.71 | 0.72 | 0.75 | 0.77 | 0.8 | 0.72 | 0.63 | 0.72 |
| Flame retardant test class |  |  | V-1 | V-1 | V-1 | V-1 | V-1 | Nonstandard | Nonstandard | Nonstandard |
| 1* |  |  | 28 | 24 | 20 | 21 | 24 | 36 | 40 | 45 |
| 2* |  |  | 142 | 130 | 115 | 125 | 134 | 179 | 190 | 202 |

In Table 1, abbreviations are as follows.

"A-1": phenol resin composition (A-1) produced in Example 1

"A-2": phenol resin composition (A-2) produced in Example 2

"A-3": phenol resin composition (A-3) produced in Example 3

"A-4": phenol resin composition (A-4) produced in Example 4

"A-5": phenol resin composition (A-5) produced in Example 5

"A-6": phenol resin composition (A-6) produced in Comparative Example 1

"A-7": naphthol novolac compound (A-7) produced in Comparative Example 2

"A-8": phenol resin composition (A-8) produced in Comparative Example 3

"N-770": phenol novolac epoxy resin ("N-770" manufactured by DIC Corporation, epoxy equivalent 183 g/eq)

"2E4MZ": 2-ethyl-4-methylimidazole

1: maximum combustion time (sec) at one time of flame contact

2: total combustion time (sec) of five test pieces

The invention claimed is:

1. A phenol resin composition comprising a naphthol novolac resin (a1) represented by general formula (1) below

[Chem. 1]

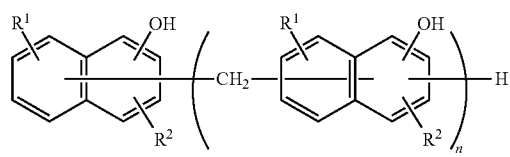

(1)

(wherein $R^1$ and $R^2$ each independently represent a hydrogen atom, an alkyl group, or an alkoxy group, and n is a repeating unit and an integer of 1 or more), and a compound (a2) represented by general formula (2) below

[Chem. 2]

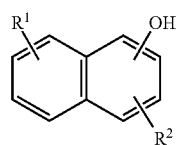

(2)

(wherein $R^1$ and $R^2$ each independently represent a hydrogen atom, an alkyl group, or an alkoxy group), wherein the total ratio of compounds with n=1 and n=2 in the general formula (1) present in the composition is in the range of 10 to 35% in terms of peak area in GPC measurement, the average of n in the general formula (1) is in the range of 3.0 to 7.0, and the content of the compound (a2) in the composition is 1 to 6% in terms of peak area in GPC measurement.

2. The phenol resin composition according to claim 1, wherein the softening point of the phenol resin composition is in the range of 115° C. to 150° C.

3. The phenol resin composition according to claim 1, further comprising a phenol novolac or alkylphenol novolac component (a3) in addition to the naphthol novolac resin (a1) and the compound (a2).

4. The phenol resin composition according to claim 3, wherein the ratio of the phenol novolac or alkylphenol novolac component (a3) present is such that the ratio of all phenol skeletons in the novolac component (a3) relative to all naphthol skeletons in the naphthol novolac resin (a1) and the compound (a2) is 0.01 to 0.2 in terms of the number of moles of phenol skeletons per mole of naphthol skeletons.

5. A curable resin composition comprising a curing agent (A) for an epoxy resin and an epoxy resin (B) as essential components, wherein the curing agent (A) for an epoxy resin is the phenol resin composition according to claim 1.

6. A cured product produced by curing reaction of the curable resin composition according to claim 5.

7. A printed circuit board comprising a reinforcement substrate produced by impregnating with a varnish-like resin composition and then lamination, the varnish-like resin composition being prepared by mixing an organic solvent (C) with the curable resin composition according to claim 5.

8. A curable resin composition comprising a curing agent (A) for an epoxy resin and an epoxy resin (B) as essential components, wherein the curing agent (A) for an epoxy resin is the phenol resin composition according to claim 2.

9. A curable resin composition comprising a curing agent (A) for an epoxy resin and an epoxy resin (B) as essential components, wherein the curing agent (A) for an epoxy resin is the phenol resin composition according to claim 3.

10. A curable resin composition comprising a curing agent (A) for an epoxy resin and an epoxy resin (B) as essential components, wherein the curing agent (A) for an epoxy resin is the phenol resin composition according to claim 4.

11. A cured product produced by curing reaction of the curable resin composition according to claim 8.

12. A cured product produced by curing reaction of the curable resin composition according to claim 9.

13. A cured product produced by curing reaction of the curable resin composition according to claim 10.

14. A printed circuit board comprising a reinforcement substrate produced by impregnating with a varnish-like resin composition and then lamination, the varnish-like resin composition being prepared by mixing an organic solvent (C) with the curable resin composition according to claim 8.

15. A printed circuit board comprising a reinforcement substrate produced by impregnating with a varnish-like resin composition and then lamination, the varnish-like resin composition being prepared by mixing an organic solvent (C) with the curable resin composition according to claim 9.

16. A printed circuit board comprising a reinforcement substrate produced by impregnating with a varnish-like resin composition and then lamination, the varnish-like resin composition being prepared by mixing an organic solvent (C) with the curable resin composition according to claim 10.

* * * * *